United States Patent
Yao

(10) Patent No.: US 11,776,299 B2
(45) Date of Patent: Oct. 3, 2023

(54) PHOTOELECTRIC SENSOR AND METHOD FOR DRIVING THE SAME, AND DISPLAY APPARATUS

(71) Applicant: Shanghai Tianma Micro-Electronics Co., Ltd., Shanghai (CN)

(72) Inventor: Qijun Yao, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 161 days.

(21) Appl. No.: 17/513,173

(22) Filed: Oct. 28, 2021

(65) Prior Publication Data

US 2022/0052101 A1 Feb. 17, 2022

(30) Foreign Application Priority Data

Sep. 16, 2021 (CN) .......................... 202111084615.3

(51) Int. Cl.
*G06V 40/13* (2022.01)
(52) U.S. Cl.
CPC ................................ *G06V 40/1318* (2022.01)
(58) Field of Classification Search
CPC ........................................... G06V 40/12–1394
See application file for complete search history.

(56) References Cited

U.S. PATENT DOCUMENTS

| | | | | |
|---|---|---|---|---|
| 8,766,651 B2* | 7/2014 | Kang | ................. | G06V 40/1306 324/662 |
| 11,106,884 B2* | 8/2021 | Ding | ................. | G06V 40/1306 |
| 11,126,812 B2* | 9/2021 | Hung | ................. | G06V 40/1318 |
| 2013/0314148 A1* | 11/2013 | Kang | ................. | G06V 40/1306 327/517 |
| 2019/0250031 A1* | 8/2019 | Ding | ................. | G09G 5/10 |
| 2020/0193118 A1* | 6/2020 | Ding | ................. | G06V 40/1306 |
| 2020/0364438 A1* | 11/2020 | Hung | ................. | G06V 40/1318 |
| 2020/0410203 A1* | 12/2020 | Chang | ................. | G06V 40/1365 |
| 2021/0365660 A1* | 11/2021 | Chen | ................. | G06V 40/1318 |
| 2021/0368125 A1* | 11/2021 | Niwa | ................. | H03M 1/123 |
| 2022/0052101 A1* | 2/2022 | Yao | ................. | G06V 40/1318 |

FOREIGN PATENT DOCUMENTS

CN 104662430 B 5/2017

\* cited by examiner

*Primary Examiner* — Patrick F Marinelli
(74) *Attorney, Agent, or Firm* — CHRISTENSEN O'CONNOR JOHNSON KINDNESS PLLC

(57) ABSTRACT

A photoelectric sensor and a method for driving the same, and a display apparatus are provided. The photoelectric sensor includes a photosensitive circuit including a photoelectric diode, a reset transistor, a voltage conversion transistor, a read control transistor, and a read transistor that is a p-type transistor. The reset transistor, a first electrode of the photoelectric diode, and a control electrode of the voltage conversion transistor are electrically connected to a first node. The voltage conversion transistor, read control transistor, and a control electrode of read transistor are all electrically connected to a second node. The reset transistor is turned on by its control electrode to reset the first node. The voltage conversion transistor and read control transistor are turned on by their control electrodes, respectively, to control a voltage of the second node. The read transistor outputs a detection signal under control of its control electrode.

20 Claims, 8 Drawing Sheets

PHOTOELECTRIC SENSOR AND METHOD FOR DRIVING THE SAME, AND DISPLAY APPARATUS

CROSS-REFERENCE TO RELATED APPLICATION

The present application claims priority to Chinese Patent Application No. 202111084615.3, filed on Sep. 16, 2021, the content of which is incorporated herein by reference in its entirety.

TECHNICAL FIELD

The present disclosure relates to the field of display technologies, and, particularly, relates to a photoelectric sensor and a method for driving the same, and a display apparatus.

BACKGROUND

Fingerprint recognition mainly identifies the person operating or being operated on the basis of the lines and detail characteristics of human fingerprints. With modern electronic integrated manufacturing technology and fast and reliable algorithms, fingerprint recognition has come into people's daily life and has become the most in-depth, widely used, and mature technology in biometrics.

Fingerprint recognition technologies applied in the display field include pressure-sensitive fingerprint recognition, ultrasonic fingerprint recognition, and photosensitive fingerprint recognition. With the proposal of a full-screen concept, under-screen fingerprint recognition has become a focus of research and development, which also promotes the development of the photosensitive fingerprint recognition.

SUMMARY

In a first aspect of the present disclosure, a photoelectric sensor is provided. The photoelectric sensor includes a photosensitive circuit, and the photosensitive circuit comprises a photoelectric diode, a reset transistor, a voltage conversion transistor, a read control transistor, a read transistor, a first node, and a second node. The read transistor is a p-type transistor. The reset transistor, a first electrode of the photoelectric diode, and a control electrode of the voltage conversion transistor are all electrically connected to the first node. The voltage conversion transistor, the read control transistor, and a control electrode of the read transistor are all electrically connected to the second node. The reset transistor is configured to be turned on under control of a control electrode of the reset transistor to reset the first node. The voltage conversion transistor and the read control transistor are configured to turn on under control of the control electrode of the voltage conversion transistor and a control electrode of the read control transistor, respectively, to control a voltage of the second node. The read transistor is configured to output a detection signal under control of the control electrode of the read transistor.

In a second aspect of the present disclosure, a method for driving a photoelectric sensor is provided. The photoelectric sensor includes a photosensitive circuit, and the photosensitive circuit includes a photoelectric diode, a reset transistor, a voltage conversion transistor, a read control transistor, a read transistor, a first node, and a second node. The read transistor is a p-type transistor. The reset transistor, a first electrode of the photoelectric diode, and a control electrode of the voltage conversion transistor are all electrically connected to the first node. The voltage conversion transistor, the read control transistor, and a control electrode of the read transistor are all electrically connected to the second node. The method includes controlling the photosensitive circuit to operate in a read stage of a working cycle. In the read stage, a voltage of the first node is provided to the control electrode of the voltage conversion transistor in such a manner that the voltage conversion transistor is controlled to be turned on, and simultaneously another voltage is provided to a control electrode of the read control transistor in such a manner that the read control transistor is controlled to be turned on, and the voltage conversion transistor and the read control transistor jointly control a voltage of the second node. In the read stage, the read transistor outputs a detection signal under control of the second node.

In a third aspect of the present disclosure, a display apparatus is provided. The display apparatus includes a photoelectric sensor. The photoelectric sensor includes a photosensitive circuit, and the photosensitive circuit comprises a photoelectric diode, a reset transistor, a voltage conversion transistor, a read control transistor, a read transistor, a first node, and a second node. The read transistor is a p-type transistor. The reset transistor, a first electrode of the photoelectric diode, and a control electrode of the voltage conversion transistor are all electrically connected to the first node. The voltage conversion transistor, the read control transistor, and a control electrode of the read transistor are all electrically connected to the second node. The reset transistor is configured to be turned on under control of a control electrode of the reset transistor to reset the first node. The voltage conversion transistor and the read control transistor are configured to turn on under control of the control electrode of the voltage conversion transistor and a control electrode of the read control transistor, respectively, to control a voltage of the second node. The read transistor is configured to output a detection signal under control of the control electrode of the read transistor.

BRIEF DESCRIPTION OF DRAWINGS

In order to more clearly illustrate technical solutions of embodiments of the present disclosure or technical solutions of the related art, the accompanying drawings used in the embodiments or the related art are briefly described below. The drawings described below are merely a part of the embodiments of the present disclosure. Based on these drawings, those skilled in the art can obtain other drawings without any creative effort.

DETAILED DESCRIPTION

In order to more clearly illustrate objects, technical solutions and advantages of embodiments of the present disclosure, the technical solutions in the embodiments of the present disclosure are clearly and completely described below with reference to the accompanying drawings in the embodiments of the present disclosure. The described embodiments are merely part of the embodiments of the present disclosure rather than all of the embodiments. All other embodiments obtained by those skilled in the art shall fall into the scope of the present disclosure.

The terms used in the embodiments of the present disclosure are merely for the purpose of describing specific embodiment, rather than limiting the present disclosure. The terms "a", "an", "the" and "said" in a singular form in the embodiments of the present disclosure and the attached claims are also intended to include plural forms thereof, unless noted otherwise.

Figure 1:
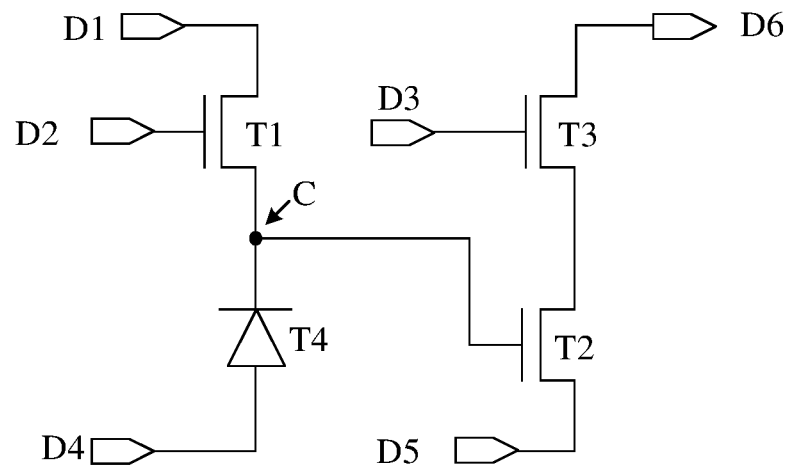
FIG. 1 is a schematic diagram showing a photosensitive circuit in the related art.

FIG. 1 is a schematic diagram showing a photosensitive circuit in the related art. As shown in FIG. 1, the photosensitive circuit includes a reset transistor T1, a read transistor T2, a read control transistor T3, and a photoelectric diode T4. Each of the transistors T1 to T3 is an n-type transistor. FIG. 1 further shows a reset signal terminal D1, a reset control terminal D2, a read control terminal D3, a common voltage terminal D4, a first voltage terminal D5, and a signal output terminal D6. The photoelectric diode T4 generates a leakage current from a node C to the common voltage terminal D4 after it is irradiated, a potential of the node C is dropped, a voltage of the output terminal of the read transistor T2 varies with the voltage of the node C, and a detection signal is output to the signal output terminal D6 after the read control transistor T3 is controlled to be turned on. To make the voltage of the output terminal of the read transistor T2 vary with the voltage of the node C, that is, the voltage of the output terminal of the read transistor T2 is correlated with the voltage of control electrode thereof, the read transistor T2 operates in a turn-on state saturation zone after it is turned on. The read transistor T2 is an n-type transistor, so that the transistor operates in the turn-on state saturation zone when following conditions are satisfied: $Vgs>Vth$ and $Vgs-Vds<Vth$, where Vgs is a voltage difference between a control electrode and a source of the transistor, Vds is a source-drain voltage difference of the transistor, Vth is a threshold voltage of the transistor, and Vth is a positive value.

Compared with p-type transistors, at least one lightly doped drain (LDD) process added when manufacturing n-type transistors, that is, the process for manufacturing n-type transistors is relatively complicated. If all transistors of the photosensitive circuit shown in FIG. 1 are p-type transistors, the process for manufacturing the photosensitive circuit can be relatively simplified, thereby reducing the cost. However, since a potential of the N-electrode of the photoelectric diode of the photosensitive circuit is dropped after it is irradiated, the read transistor connected to the N-electrode of the photoelectric diode is an n-type transistor, so that they can be operated in a normal operating range. If each of the transistors shown in FIG. 1 is manufactured to be a p-type transistor, a detectable dynamic range is narrow, which affects accuracy of fingerprint recognition. A dynamic range shall be understood as a range between a maximum signal value and a minimum signal value of a collected detection signal.

In the circuit shown in FIG. 1, since the photoelectric diode T4 receives light with different light intensity, it generates leakage currents with different values. The leakage current due to light irradiation causes a potential drop of the node C. The longer the light irradiation is, the higher the voltage of node C is, and then the lower the voltage of the control electrode of the read transistor T2 will be. That is, the smaller the voltage Vg of the control electrode of the transistor will be, so that the smaller Vgs will be. If the read transistor T2 is a p-type transistor, following conditions upon the read transistor T2 operating in the turn-on state saturation zone are satisfies: $Vgs<Vth$, and $Vgs-Vds>Vth$, where Vth is a negative value. When the voltage Vg is too low, the smaller the Vgs, the smaller Vgs-Vds will be, and then the operating condition of $Vgs-Vds>Vth$ cannot be satisfied any more. At this time, the read transistor T2 cannot operate in the turn-on state saturation zone. The voltage of the output terminal of the transistor T2 cannot vary with its gate voltage, so that finally the detection signal output by the signal output terminal D6 of the photosensitive circuit cannot reflect the voltage change of the node C, thereby affecting the operation of the photosensitive circuit. That is, after each of the transistors in the circuit is set as a p-type transistor, a dynamic range of the photosensitive circuit becomes narrow, which will affect the accuracy of fingerprint recognition when fingerprint recognition detection is performed in application.

Based on the above problems occurring in the related art, the present disclosure provides a photoelectric sensor. The structure of the photosensitive circuit is designed, so that when the read transistor is a p-type transistor, the photosensitive circuit still has a relatively wide dynamic range, thereby achieving the accuracy of fingerprint recognition when fingerprint recognition detection is performed in application.

Figure 2:
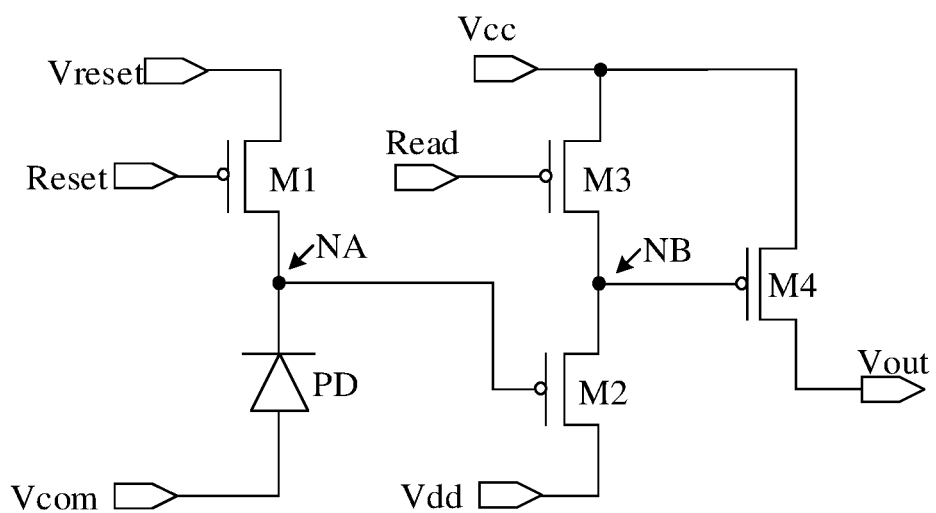
FIG. 2 is a schematic diagram showing a photosensitive circuit according to an embodiment of the present disclosure.

The present disclosure provides a photoelectric sensor configured for optical fingerprint recognition detection. In an embodiment, the photoelectric sensor includes a plurality of photosensitive circuits. FIG. 2 is a schematic diagram showing a photosensitive circuit according to an embodiment of the present disclosure. As shown in FIG. 2, the photosensitive circuit includes a photoelectric diode PD, a reset transistor M1, a voltage conversion transistor M2, a read control transistor M3, a read transistor M4, a first node NA, and a second node NB. At least the read transistor M4 is a p-type transistor. In an embodiment, the photoelectric diode PD is a PIN-type photoelectric diode.

The reset transistor M1, a first electrode of the photoelectric diode PD, and a control electrode of the voltage conversion transistor M2 are all electrically connected to the first node NA. The voltage conversion transistor M2, the read control transistor M3, and a control electrode of the read transistor M4 are all electrically connected to the second node NB.

The reset transistor M1 is configured to be turned on under control of its control electrode so as to reset the first node NA.

The voltage conversion transistor M2 and the read control transistor M3 are configured to be turned on under control of their respective control electrodes, respectively, to control a voltage of the second node NB.

The read transistor M4 is configured to output a detection signal under control of its control electrode. The control electrode of the read transistor M4 is electrically connected to the second node NB. That is, the read transistor M4 can output a detection signal under control of the voltage of the second node NB.

In the related art shown in FIG. 1, the control electrode of the read transistor T2 is directly connected to the node C. As the photoelectric diode T4 is irradiated longer, the potential of the node C becomes lower, the voltage of the control electrode of the read transistor T2 is gradually decreased, so that the p-type read transistor T2 cannot satisfy the operating condition of Vgs−Vds>Vth anymore, thereby causing a dynamic range of the photosensitive circuit to be too narrow.

In the present disclosure, the first electrode of the photoelectric diode PD is electrically connected to the first node NA, and the control electrode of the p-type read transistor M4 is not directly connected to the first node NA. That is, the control electrode of the read transistor M4 is not directly connected to the first electrode of the photoelectric diode PD, so that the turn-on state of the read transistor M4 is not directly affected by the voltage of the first node NA. Therefore, the turn-on state of the read transistor M4 is not directly affected by the voltage of the first node NA, which prevents the voltage of the first node NA from dropping too much and prevents the voltage of the control electrode of the read transistor M4 exceeding the voltage range to be satisfied by its operating conditions from effecting a detectable dynamic range of the photosensitive circuit.

The photosensitive circuit includes the voltage conversion transistor M2, and the control electrode of the voltage conversion transistor M2 is connected to the first node NA. The turn-on state of the voltage conversion transistor M2 is directly affected by the voltage of the first node NA, and a second electrode of the voltage conversion transistor M2 is electrically connected to the second node NB, so that the voltage of the second node NB is affected by the voltage of the first node NA. The read control transistor M3 is electrically connected to the second node NB. When the control transistor M3 and the voltage conversion transistor M2 are turned on at the same time, the voltage of the second node NB can be jointly controlled by the control transistor M3 and the voltage conversion transistor M2. With such configuration, a voltage for controlling the operating state of the read transistor M4 can be converted according to a variation rule of the voltage of the first node NA. In this way, as the photoelectric diode PD is irradiated for a longer time, the potential of the first node NA becomes lower, the higher the voltage of the second node NB, and the higher the voltage provided to the control electrode of the read transistor M4, so that it can be adapted to the operating characteristics of the p-type transistor, and the p-type read transistor M4 can continue to operate in the saturation zone, thereby achieving a relatively wide dynamic range of the photosensitive circuit.

The present disclosure can control the voltage variation range of the second node NB to be within the voltage range that the operating conditions of the read transistor M4 are satisfied, so that the photosensitive circuit has a relatively wide dynamic range, and fingerprint recognition accuracy can be achieved when fingerprint recognition detection is performed in application. The present disclosure also provides a method for driving the photosensitive circuit provided by embodiments of the present disclosure. The method includes controlling the photosensitive circuit to operate in a reset stage and a read stage of a working cycle.

In the reset stage, a signal is provided to the control electrode of the reset transistor M1, so that the reset transistor M1 is controlled to be turned on to reset the first node NA.

In the read stage, the photoelectric diode PD generates a leakage current after it is irradiated, and the voltage of the first node NA is dropped. A voltage of the first node NA is provided to the control electrode of the voltage conversion transistor M2 to control the voltage conversion transistor M2 to be turned on, and simultaneously another voltage is provided to the control electrode of the read control transistor M3 to control the read control transistor M3 to be turned on. After the voltage conversion transistor M2 and the read control transistor M3 are both turned on, the voltage conversion transistor M2 and the read control transistor M3 jointly control the voltage of the second node NB. The control electrode of the read transistor M4 is electrically connected to the second node NB, and the read transistor M4 outputs a detection signal under control of the second node NB.

The leakage current generated by the photoelectric diode PD is different when the photoelectric diode PD is irradiated by light with different light intensity. The stronger the light intensity is, the greater the leakage current will be, and the greater the corresponding voltage drop of the first node NA will be. Since the control electrode of the voltage conversion transistor M2 is electrically connected to the first node NA, the voltage of the first node NA affects the turn-on state of the voltage conversion transistor M2, which affects the voltage of the second node NB. That is, the voltage of the second node NB is correlated with the voltage of the first node NA.

In the read stage, the read control transistor M3 is controlled to be turned on, the read control transistor M3 and the voltage conversion transistor M2 jointly control the voltage of the second node NB, and the voltage of the second node NB affects the turn-on state of the read transistor M4, which affects the detection signal output by the photosensitive circuit.

In the present disclosure, the turn-on state of the read transistor M4 is indirectly affected by the voltage of the first node NA, so that the turn-on state of the read transistor M4 is correlated with the voltage of the first node NA. Meanwhile, the voltage conversion transistor M2 and the read control transistor M3 jointly controls the voltage of the second node NB, the voltage that controls the operating state of the read transistor M4 can be converted with the variation rule of the voltage of the first node NA, and the voltage variation range of the second node NB can be controlled to be within the voltage range that the operating conditions of the read transistor M4 are to be satisfied, so that the photosensitive circuit has a relatively wide dynamic range, thereby ensuring the accuracy of fingerprint recognition when it is applied in the fingerprint recognition detection.

In an embodiment, if each of the transistors of the photosensitive circuit is a p-type transistor, an LDD process is not required when it is manufactured, so that the processes can be simplified, thereby reducing the cost.

As shown in FIG. 2, the control electrode of the reset transistor M1 is configured to receive a reset control signal Reset, the first electrode of the reset transistor M1 is configured to receive a reset signal Vreset, and the second electrode of the reset transistor M1 is electrically connected to the first node NA. The first electrode of the voltage conversion transistor M2 is configured to receive a first voltage signal Vdd, and the second electrode of the voltage conversion transistor M2 is electrically connected to the second node NB. The control electrode of the read control transistor M3 is configured to receive a read control signal read, the first electrode of the read control transistor M3 is configured to receive a second voltage signal, and the second electrode of the read control transistor M3 is electrically connected to the second node NB. The first electrode of the read transistor M4 is configured to receive a second voltage signal Vcc, and the read transistor M4 is turned on under control of the voltage of its control electrode, and output a detection signal Vout. The first electrode of the photoelectric diode PD is electrically connected to the first node NA, and the second electrode is configured to receive a common voltage signal Vcom.

Figure 3:
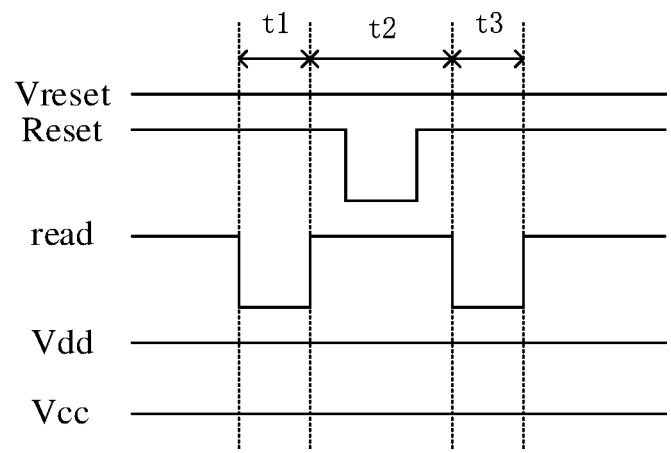
FIG. 3 is a timing sequence diagram showing a photosensitive circuit according to an embodiment of the present disclosure.

FIG. 3 is a timing sequence diagram showing a photosensitive circuit according to an embodiment of the present disclosure. In an embodiment, as shown in FIG. 3, an operating process of the photosensitive circuit includes a first read stage t1, a reset stage t2, and a second read stage t3.

In the reset stage t2, the reset control signal Reset is provided to the control electrode of the reset transistor M1, where the reset control signal Reset is a pulse signal, and a low level-signal of the reset control signal Reset is an enable signal to turn on the reset transistor M1. At this stage, after the control electrode of the reset transistor M1 receives the enable signal, the reset transistor M1 is controlled to be turned on, the first electrode and the second electrode of the reset transistor M1 are turned on, and the reset signal Vreset received by the first electrode of the reset transistor M1 is provided to the first node NA to reset the first node NA. In an embodiment, the voltage value of the reset signal Vreset is −3V.

A voltage value of a common voltage signal Vcom can be smaller than a voltage value of the reset signal Vreset, so that a potential of the first node NA is higher than a potential of the second electrode of the photoelectric diode PD in the reset stage t2. When the photoelectric diode PD is not irradiated, the photoelectric diode PD is in a reverse bias cut-off state.

In the first read stage t1, when a non-enable signal of the reset control signal Reset is provided to the control electrode of the reset transistor M1, the reset transistor M1 is turned off. The photoelectric diode PD generates a leakage current flowing from the first electrode to the second electrode under the light irradiation, and the potential at the first node NA is dropped. When the control electrode of the voltage conversion transistor M2 is electrically connected to the first node NA, the voltage conversion transistor M2 is turned on under control of the voltage signal of the first node NA. The read control signal read as shown in FIG. 3 is a pulse signal, and a low-level signal of the read control signal read is an enable signal to turn on the read control transistor M3. At this stage, an enable signal is provided to the control electrode of the read control transistor M3, so that the read control transistor M3 is controlled to be turned on. That is, at this stage, the voltage conversion transistor M2 and the read control transistor M3 jointly control the voltage of the second node NB, and the read transistor M4 outputs a detection signal under control of the voltage of the second node NB.

The voltage conversion transistor M2 and the read control transistor M3 jointly control the voltage of the second node NB, so that the voltage of the second node NB can be controlled to vary with the voltage of the first node NA. The read transistor M4 is turned on under the control of the second node NB, so that the detection signal output by the read transistor M4 varies with the voltage of the second node NB, thereby achieving a correlation between the detection signal and the voltage of the first node NA.

As the irradiation time of the photoelectric diode PD is prolonged, the potential of the first node NA is continuously dropped.

In the second read stage t3, a non-enable signal of the reset control signal Reset is provided to the control electrode of the reset transistor M1, so that the reset transistor M1 is turned off. The voltage conversion transistor M2 is turned on under the control of the voltage signal of the first node NA, and at the same time, an enable signal of the read control signal read is provided to the control electrode of the read control transistor M3 to turn on the read control transistor M3. The voltage conversion transistor M2 and the read control transistor M3 jointly control the voltage of the second node NB, and the read transistor M4 outputs a detection signal again under the control of the voltage of the second node NB.

The detection signal obtained in the first read stage t1 can be regarded as an initial detection value. As the irradiation time of the photoelectric diode PD is prolonged, the potential at the position of the first node NA is continuously dropped. In the second read stage t3, the detection signal after a certain irradiation time is detected. The detection signal obtained in the two read stages can reflect the potential drop of the first node NA, and can also reflect the light intensity received by the photoelectric diode PD.

When it is applied in fingerprint detection, different fingerprint zones correspond to different photosensitive circuits of the photoelectric sensor. In the unused fingerprint zone, the photoelectric diode PD has a different light intensity. The plurality of photosensitive circuits of the photoelectric sensor respectively execute the above-mentioned operating stages to obtain the overall light intensity of the fingerprint recognition zone, so that a fingerprint pattern is determined according to the light intensity, thereby achieving fingerprint recognition.

In an embodiment, as shown in FIG. 3, the reset signal Vreset is a constant voltage signal.

In an embodiment, as shown in FIG. 3, the first voltage signal Vdd and the second voltage signal Vcc are both constant voltage signals, and a voltage value of the first voltage signal Vdd is different from a voltage value of the second voltage signal Vcc.

In an embodiment, in the read stage, the read transistor M4 is turned on under the control of the second node NB, so that the detection signal output by the read transistor M4 varies with the voltage of the second node NB, including that the read transistor M4 is controlled to operate in the saturation zone under the control of node B. According to the characteristics of the field-effect transistor, when the transistor is operating in the saturation zone, its output voltage varies with the voltage of its control electrode. When the driving photosensitive circuit is operating in the read stage, the read transistor M4 is controlled to operate in the saturation zone by the voltage of the second node NB, and the read transistor M4 can be configured to output the detection signal, so that the detection signal is correlated with and the light irradiation intensity of the photoelectric diode PD.

In an embodiment, when the photosensitive circuit is driven to operate in the read stage, the voltage of the second node NB is controlled by simultaneously turning on the voltage conversion transistor M2 and the read control transistor M3, so that the voltage of the second node NB is controlled to increase as the voltage of the first node NA is decreased. In the read stage, as the irradiation time of the photoelectric diode PD is prolonged, the voltage of the first node NA is decreased, and the voltage of the second node NB is increased as the voltage of the first node NA is decreased. That is, as the irradiation time of the photoelectric diode PD is prolonged, the voltage of the second node NB may be gradually increased. The voltage of the second node NB can control the turn-on state of the read transistor M4.

For the read transistor M4, in case that Vs (the source voltage of the transistor, here corresponding to the voltage of the first electrode of the read transistor M4) and Vth are fixed, as the irradiation time of the photoelectric diode PD is prolonged, the voltage of the second node NB is gradually increased, and the Vgs of the read transistor M4 may be increased, so that the read transistor M4 can continuously satisfy the operating condition of Vgs–Vds>Vth so as to control the read transistor M4 to operate in the saturation zone. In the present disclosure, the voltage conversion transistor and the read transistor jointly control the voltage of the second node NB, the voltage for controlling the operating state of the read transistor M4 can be converted with the variation rule of the voltage of the first node NA, so that as the irradiation time of the photoelectric diode PD is prolonged, the voltage provided to the control electrode of the read transistor M4 is gradually increased. Therefore, it can be adapted to the operating characteristics of the p-type transistor, and the p-type read transistor M4 can continue to operate in the saturation zone, thereby achieving a wide dynamic range of the photosensitive circuit.

Figure 4:
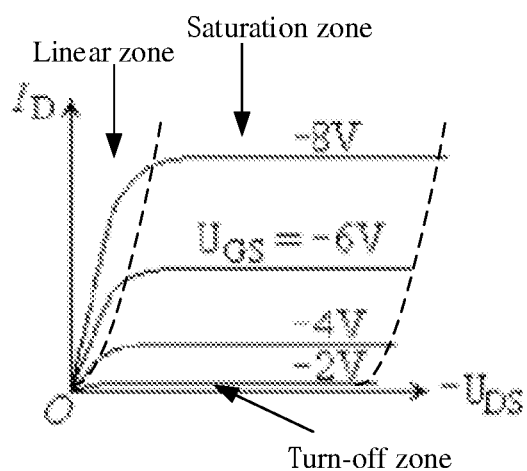
FIG. 4 is a schematic diagram showing a characteristic curve of a p-type transistor.

FIG. 4 is a schematic diagram showing a characteristic curve of a p-type transistor. FIG. 4 only illustrates operating characteristics of the p-type transistor. The numerical parameters shown in FIG. 4 do not limit the characteristic parameters of the transistors in the present disclosure. FIG. 4 shows a linear zone, a saturation zone, and a cut-off zone. The abscissa $U_{DS}$ represents a voltage difference between a drain electrode and a source electrode of a transistor, $U_{GS}$ represents a voltage difference between a gate electrode and a source electrode of the transistor, and $I_D$ represents a leakage current of the transistor. A threshold voltage of the transistor shown in FIG. 4 is −2V, that is, when $U_{GS}$ is greater than −2V, the transistor is in a turn-off state. It can be seen from FIG. 4 that for a p-type transistor, when it operates in the saturation zone, the generated turn-on state leakage current is gradually decreased as its gate voltage is gradually increased.

In an embodiment of the present disclosure, the read transistor M4 is a p-type transistor. When the photosensitive circuit is driven to operate in the read stage, the read transistor M4 is turned on under the control of the second node NB, so that the detection signal output by the read transistor M4 is decreased as the voltage of the second node NB is increased. In this way, the read transistor M4 is controlled by the voltage of the second node NB to operate in the saturation zone, so that the detection signal output by the read transistor M4 is correlated with the voltage of the second node NB. Then, the detection signal output by the read transistor M4 is correlated with the voltage of the first node NA, so that the output detection signal can reflect the light irradiation intensity of the photoelectric diode PD.

In an embodiment, turning on the voltage conversion transistor M2 and the read control transistor M3 simultaneously to jointly control the voltage of the second node NB when the photosensitive circuit is driven to operate in the read stage includes controlling the voltage conversion transistor M2 and the read control transistors M3 to operate in the linear zone.

The voltage of the first node NA is provided to the control electrode of the voltage conversion transistor M2 to control the voltage conversion transistor M2 to operate in the linear zone. A turn-on resistance of the voltage conversion transistor M2 varies with the voltage of the first node NA.

A constant voltage signal is provided to the control electrode of the read control transistor M3 to control the read control transistor M3 to operate in the linear zone.

From the characteristic curve of the p-type transistor shown in FIG. 4, it can be ascertained that when the transistor is operating in the linear zone, then the turn-on resistance of the transistor is correlated with the voltage of the control electrode of the transistor. There is a positive correlation between the turn-on resistance of the transistor and the voltage of the control electrode of the transistor. When the voltage of the control electrode of the transistor is constant, the turn-on resistance of the transistor is also constant, so that the transistor is equivalent to a resistor with a fixed resistance.

In an embodiment of the present disclosure, the voltage conversion transistor M2 is a p-type transistor. The voltage conversion transistor M2 is controlled by the voltage of the first node NA to operate in the linear zone, so that the turn-on resistance of the voltage conversion transistor M2 is decreased as the voltage of the first node NA is decreased, and the turn-on resistance of the corresponding voltage conversion transistor M2 is increased as the voltage of the first node NA is increased. The voltage of the first node NA varies with the light irradiation situation of the photoelectric diode PD in application, so that the voltage conversion transistor M2 can be regarded as a variable resistor due to influence of the voltage of the first node NA.

In an embodiment, the read control transistor M3 is a p-type transistor, so that a constant voltage signal is provided to the control electrode of the read control transistor M3 to control the read control transistor M3 to operate in the linear zone. Therefore, the turn-on resistance of the read control transistor M3 can be constant, so that the read control transistor M3 is equivalent to a resistor with a fixed resistance.

In combination with the circuit structure shown in FIG. 2, the second electrode of the voltage conversion transistor M2 and the second electrode of the read control transistor M3 are both electrically connected to the second node NB. Providing a voltage of the first node NA to the control electrode of the voltage conversion transistor M2 to control the voltage conversion transistor M2 to operate in the linear zone, includes: providing the voltage of the first node NA to the control electrode of the voltage conversion transistor M2, and providing a first voltage signal Vdd to the first electrode of the voltage conversion transistor M2 to control the voltage conversion transistor M2 to operate in the linear zone. Providing a constant voltage signal to the control electrode of the read control transistor M3 so as to control the read control transistor M3 to operate in the linear zone includes providing a read control signal to the control electrode of the read control transistor M3, and providing a second voltage signal Vcc to the first electrode of the read control transistor M3, so as to control the read control transistor M3 to operate in the linear zone.

When the turn-on resistance of the voltage conversion transistor M2 is a variable resistance, and the turn-on resistance of the read control transistor M3 is a fixed resistance, the first voltage signal Vdd and the second voltage signal Vcc are set to be constant at least in the read stage, so that the voltage at the position of the second node NB may vary with the turn-on resistance of the voltage conversion transistor M2. The turn-on resistance of the voltage conversion transistor M2 is correlated with the voltage of the first node NA, so that the voltage of the second node NB is correlated with the voltage of the first node NA. Meanwhile, the voltage value of the second node NB can be controlled to be between the voltage value of the first voltage signal Vdd and the voltage value of the second voltage signal Vcc, so that the voltage range of the control electrode of the read transistor M4 can be controlled, and the operating state of the read transistor M4 can be controlled.

The smaller the voltage of the first node NA is, the smaller the turn-on resistance of the voltage conversion transistor M2 is, so that the voltage value at the second node NB is closer to the voltage value of the first voltage signal Vdd.

If the voltage value of the first voltage signal Vdd is greater than the voltage value of the second voltage signal Vcc, the voltage conversion transistor M2 and the read control transistor M3 are controlled to operate in the linear zone, so that the voltage of the second node NB can be controlled to vary with the voltage of the first node NA, and the voltage of the second node NB is increased as the voltage of the first node NA is decreased. Therefore, as the light irradiation time of the photoelectric diode PD is prolonged, the potential of the first node NA becomes lower, and the potential of the second node NB becomes higher, so that the voltage provided to the control electrode of the read transistor M4 will be higher. In this way, it can be adapted to the operating characteristics of the p-type transistor, and the p-type read transistor M4 can continue to operate in the saturation zone under the control of the second node NB, thereby achieving a wide dynamic range of the photosensitive circuit.

In an embodiment, the voltage value of the first voltage signal Vdd is 0V, and the voltage value of the second voltage signal Vcc is −7V.

Figure 5:
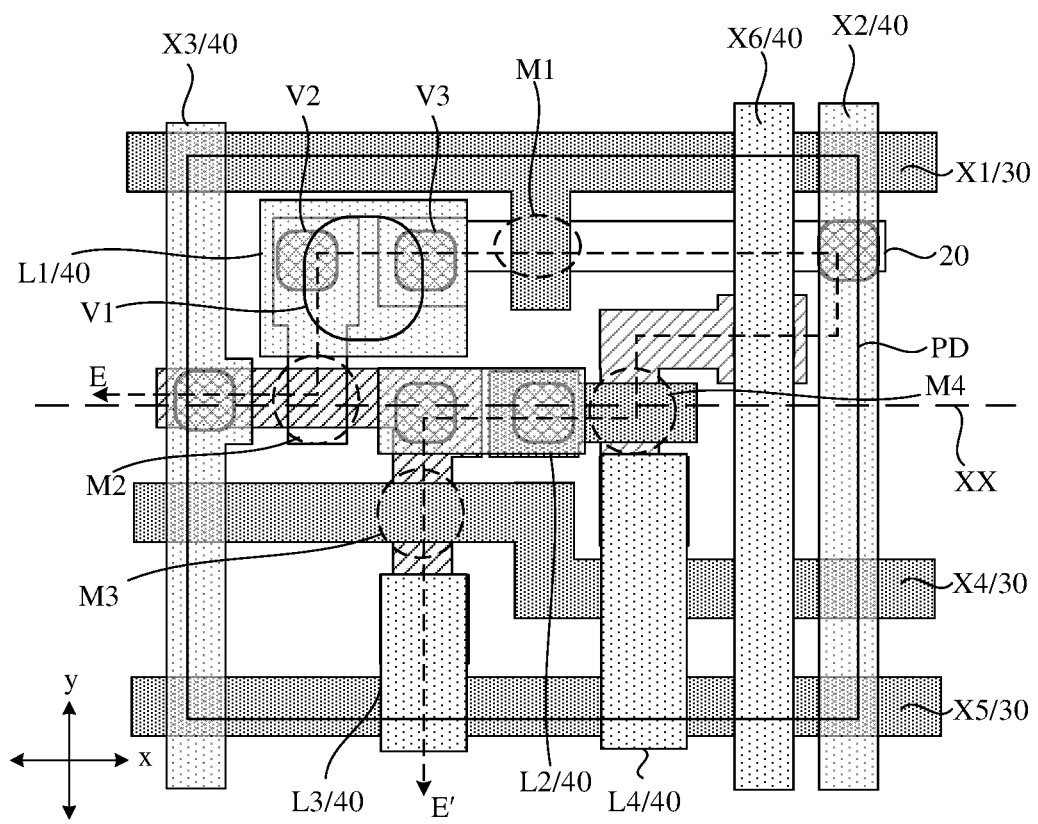
FIG. 5 is a schematic diagram showing a layout design of a photosensitive circuit according to an embodiment of the present disclosure.
Figure 6:
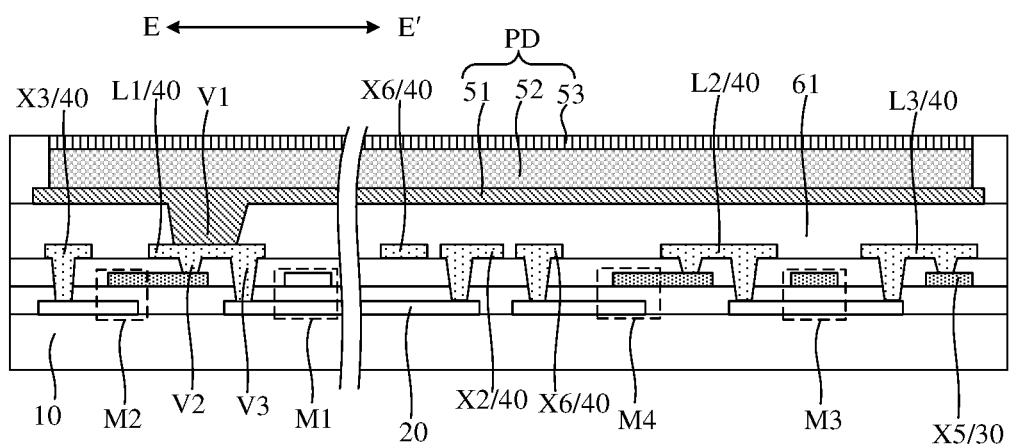
FIG. 6 is a cross-sectional view along line E-E' shown in FIG. 5 according to an embodiment of the present disclosure.

FIG. 5 is a schematic diagram showing a layout design of a photosensitive circuit according to an embodiment of the present disclosure. FIG. 6 is a cross-sectional view along line E-E' shown in FIG. 5 according to an embodiment of the present disclosure.

FIG. 5 shows four transistors of a photosensitive circuit and various signal lines configured to drive the photosensitive circuit to operate. In an embodiment, as shown in FIG. 5, the photoelectric sensor includes a reset control line X1, a reset signal line X2, a first voltage line X3, a read control line X4, a second voltage line X5, and a read data line X6.

A control electrode of the reset transistor M1 is electrically connected to a reset control line X1 configured to provide a reset control signal Reset. The first electrode of the reset transistor M1 is electrically connected to a reset signal line X2 configured to provide the reset signal Vreset. The first electrode of the voltage conversion transistor M2 is electrically connected to a first voltage line X3 configured to provide the first voltage signal Vdd. The control electrode of the read control transistor M3 is electrically connected to a read control line X4 configured to provide a read control signal read. The first electrode of the read control transistor M3 and the first electrode of the read transistor M4 are both electrically connected to a second voltage line X5 configured to provide the second voltage signal Vcc. The second electrode of the read transistor M4 is electrically connected to a read data line X6 configured to collect the detection signal.

It should be noted that the structures filled with the same pattern in the present disclosure are located in the same layer of the photoelectric sensor.

In an embodiment, as shown in FIG. 5, the reset control line X1, the read control line X4, and the second voltage line X5 each extend along a first direction x, and the read control line X4 is located between the reset control line X1 and the second voltage line X5; and the first voltage line X3, the reset signal line X2, and the read data line X6 each extend along a second direction y intersecting the first direction x. The limitation on the extension direction of various signal lines in the present disclosure only describes an approximate routing direction of each signal line, and does not limit the line types of various signal lines. The present disclosure does not limit various signal lines to be straight lines. Taking the reading control line X4 illustrated in FIG. 5 as an example, the reading control line X4 extends along the first direction x, and some line segments of the reading control line X4 in its extension direction can be a broken line.

In an embodiment, the control electrode of the voltage conversion transistor M2 and the control electrode of the read transistor M4 are located on a first virtual straight line XX, and the reset transistor M1 and the read control transistor M3 are located at two sides of the first virtual straight line XX, respectively. The first virtual straight line XX in FIG. 5 is merely a schematic representation. It can be understood that in an actual structure, the control electrode of the voltage conversion transistor M2 and the control electrode of the read transistor M4 are not a dot, but both have a certain area. In the present disclosure, a straight line passing through both the control electrode of the voltage conversion transistor M2 and the read transistor M4 can be regarded as the first virtual straight line XX.

In the present disclosure, the photosensitive circuit includes four transistors, and the reset transistor M1 and the read control transistor M3 are located at two sides of the first virtual straight line XX, respectively. According to an interconnection relationship between the four transistors, the arrangement manner of the four transistors is designed so that the four transistors are arranged in a relatively compact manner, which can save the area occupied by the photosensitive circuit.

In an embodiment, referring to FIG. 5, in the second direction y, the reset transistor M1, the voltage conversion transistor M2, the read control transistor M3, and the read transistor M4 are all located between the reset control line X1 and the second voltage line X5; and in the first direction x, the reset transistor M1, the voltage conversion transistor M2, the read control transistor M3, and the read transistor M4 are all located between the first voltage line X3 and the read data line X6. The reset control line X1 and the second voltage line X5 extend in a same direction and are insulated from and cross the first voltage line X3 and the read data line X6. The four signal lines shown in FIG. 5 define a space with a similar rectangular shape in which the four transistors of the photosensitive circuit are located. With such configuration, the arrangement of the photosensitive circuit is more regular and compact, which further reduces the occupied area of the photosensitive circuit.

The layout design according to the present disclosure can increase the number of photosensitive circuits and improve the resolution of the photoelectric sensor when the size of the photoelectric sensor is fixed. When it is applied in fingerprint recognition detection, the accuracy of fingerprint detection can be improved.

As shown in FIG. 5, for the first voltage line X3, the reset signal line X2, and the read data line X6 that drive a photosensitive circuit to operate, the read data line X6 is located between the first voltage line X3 and the reset signal line X2. In another embodiment, for the first voltage line X3, the reset signal line X2, and the read data line X6 that drive a photosensitive circuit to operate, the reset signal line X2 is located between the first voltage line X3 and the read data line X6.

FIG. 6 shows a structure of layers of a photoelectric sensor. As shown in FIG. 6, the photoelectric sensor includes a substrate 10, and a semiconductor layer 20, a first metal layer 30, and a second metal layer 40 that are sequentially arranged away from the substrate 10. The photoelectric diode PD is located at a side of the second metal layer 40 facing away from the substrate 10. The photoelectric diode PD includes a first electrode 51, an active layer 52, and a second electrode 53.

Referring to FIG. 5 and FIG. 6, it can be understood that the active layers of various transistors of the photosensitive circuit are located in the semiconductor layer 20. It can be understood that, for one transistor, the zone of the semiconductor layer 20 that overlaps with the control electrode of the transistor is the active layer of the transistor. The control electrodes of various transistors of the photosensitive circuit, the reset control line X1, the read control line X4, and the second voltage line X5 are located in the first metal layer 30. The first voltage line X3, the reset signal line X2, and the read data line X6 are located in the second metal layer 40.

FIG. 5 and FIG. 6 also show a first connection line L1, a second connection line L2, a third connection line L3, and a fourth connection line L4 that are all located in the second metal layer 40.

The first electrode 51 of the photoelectric diode PD is connected to the first connection line L1 through a first via V1, one end of the first connection line L1 is electrically connected to the control electrode of the voltage conversion transistor M2 through a second via V2, and the other end of the first connection line L1 is electrically connected to the second electrode of the reset transistor M1 through a third via V3. That is, with the configuration of the first connection line L1, the first electrode 51 of the photoelectric diode PD, the control electrode of the voltage conversion transistor M2, and the second electrode of the reset transistor M1 are electrically connected to each other.

It can be seen from FIG. 5 that the second electrode of the voltage conversion transistor M2 and the second electrode of the read control transistor M3 are both located in the semiconductor layer 20 and are directly connected to each other. It can be seen from FIG. 6 that one end of the second connection line L2 is connected to the semiconductor layer 20 through a via, and the other end of the second connection line L2 is connected to the control electrode of the read transistor M4 through a via. With the configuration of the second connecting line L2, the second electrode of the voltage conversion transistor M2, the second electrode of the read control transistor M3, and the control electrode of the read transistor M4 are electrically connected to each other.

The first end of the third connection line L3 is connected to the second voltage line X5 through a via, and the other end of the third connection line L3 is connected to the first electrode of the read control transistor M3 through a via, so that a second voltage signal Vcc is provided to the first electrode of the read control transistor M3 through the second voltage line X5.

The first end of the fourth connecting line L4 is connected to the second voltage line X5 through a via, and the other end of the fourth connecting line L4 is connected to the first electrode of the read transistor M4 through a via, so that a second voltage signal Vcc is provided to the first electrode of the read transistor M4 through the second voltage line X5.

In the present disclosure, when the photoelectric sensor is manufactured, a patterned semiconductor layer 20 and a patterned first metal layer 30 are sequentially manufactured on the substrate 10; a via for the insulating layer is then manufactured by a punching process; and then a patterned second metal layer 40 is manufactured, and the first connection line L1 to the fourth connection line L4, the first voltage line X3, the reset signal line X2, and the read data line X6 are formed. Before the process of the photoelectric diode PD, only one punching process is performed.

FIG. 6 also shows a planarization layer 61 made of organic material and located between the second metal layer 40 and the photoelectric diode PD. The planarization layer 61 is manufactured after the process of the second metal layer 40, so that the planarization layer 61 can serve as a relatively flat substrate for manufacturing the photoelectric diode PD thereon.

Figure 7:
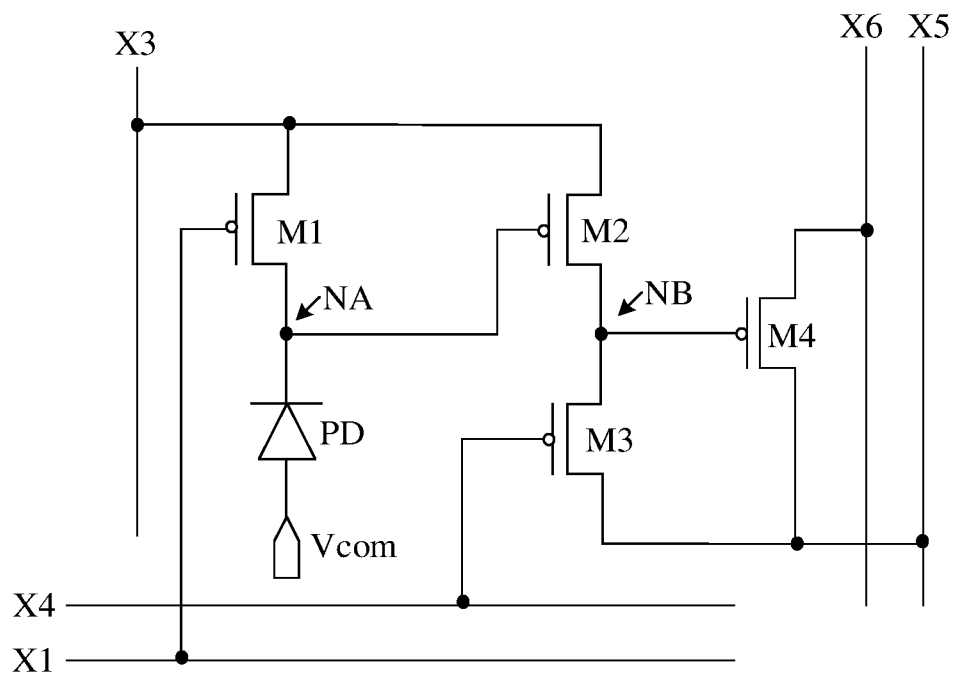
FIG. 7 is a schematic diagram showing a photosensitive circuit according to an embodiment of the present disclosure.
Figure 8:
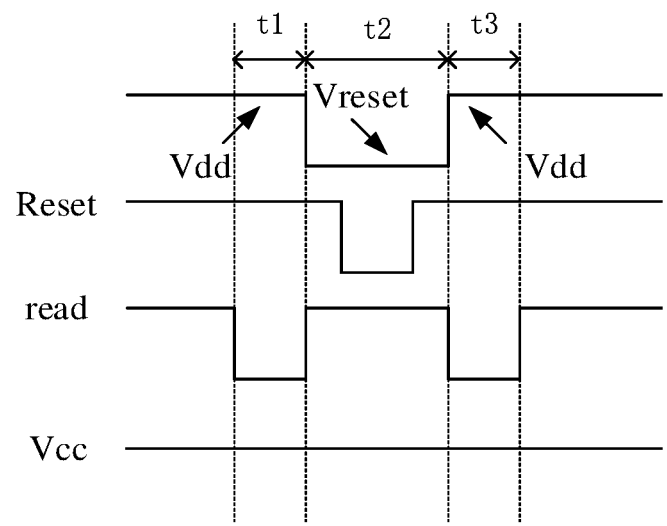
FIG. 8 is a timing sequence diagram showing the photosensitive circuit shown in FIG. 7 according to an embodiment of the present disclosure.

FIG. 7 is a schematic diagram showing a photosensitive circuit according to an embodiment of the present disclosure, and FIG. 8 is a timing sequence diagram showing the photosensitive circuit shown in FIG. 7 according to an embodiment of the present disclosure.

As shown in FIG. 7, a control electrode of the reset transistor M1 is electrically connected to a reset control line X1 configured to provide a reset control signal Reset. As shown in FIG. 8, the reset control signal Reset is a pulse signal, and a low-level signal of the reset control signal Reset is an enable signal to turn on the reset transistor M1.

The first electrode of the reset transistor M1 and the first electrode of the voltage conversion transistor M2 are both electrically connected to a first voltage signal line X3 configured to provide a reset signal Vreset to a first electrode of the reset transistor M1 in a first time period, and configured to provide a first voltage signal Vdd to a first electrode of the voltage conversion transistor M2 in a second time period. The voltage value Vreset of the reset signal is different from the voltage value of the first voltage signal Vdd.

The control electrode of the read control transistor M3 is electrically connected to a read control line X4 configured to provide a read control signal read. As shown in FIG. 8, the read control signal read is a pulse signal, and a low-level signal of the read control signal read is an enable signal to turn on the read control transistor M3.

The first electrode of the read control transistor M3 and the first electrode of the read transistor M4 are both electrically connected to a second voltage line X5 configured to provide a second voltage signal Vcc. The second voltage signal Vcc is a constant voltage signal.

The second electrode of the read transistor M4 is electrically connected to a read data line X6 configured to collect the detection signal.

In an embodiment of the present disclosure, the first voltage signal line X3 provides different voltage signals with different voltage values in different time periods. As shown in FIG. 8, an operating process of the photosensitive circuit includes a reset stage t2 and two read stages (a first read stage t1 and a second read stage t2). The reset stage t2 is the first time period. In the reset stage t2, the first voltage signal line X3 provides a reset signal Vreset to the first electrode of the reset transistor M1, meanwhile, the reset control line X1 provides a reset control signal Reset to the control the reset transistor M1 to turn on, so that the reset transistor M1 resets the first node NA through the reset signal Vreset. The read stage is a second time period. In the read stage, the first voltage signal line X3 provides the first voltage signal Vdd to the first electrode of the voltage conversion transistor M2. In this stage, the voltage conversion transistor M2 operates in the linear zone after being turned on under control of the voltage of its control electrode.

The signal provided by the first voltage signal line X3 is a pulse signal. A low-level signal part of the pulse signal is the reset signal Vreset, and a high-level part of the pulse signal is the first voltage signal Vdd. In the reset stage t2, the first voltage signal line X3 provides the reset signal Vreset to the first electrode of the reset transistor M1. In the read stage, the first voltage signal line X3 provides the first voltage signal Vdd to the first electrode of the voltage conversion transistor M2.

The first voltage signal line X3 provides different voltage signals in time-division manner, so that the number of signal lines in the photoelectric sensor can be reduced, thereby saving wiring space, and improving the resolution of the photoelectric sensor.

Figure 9:
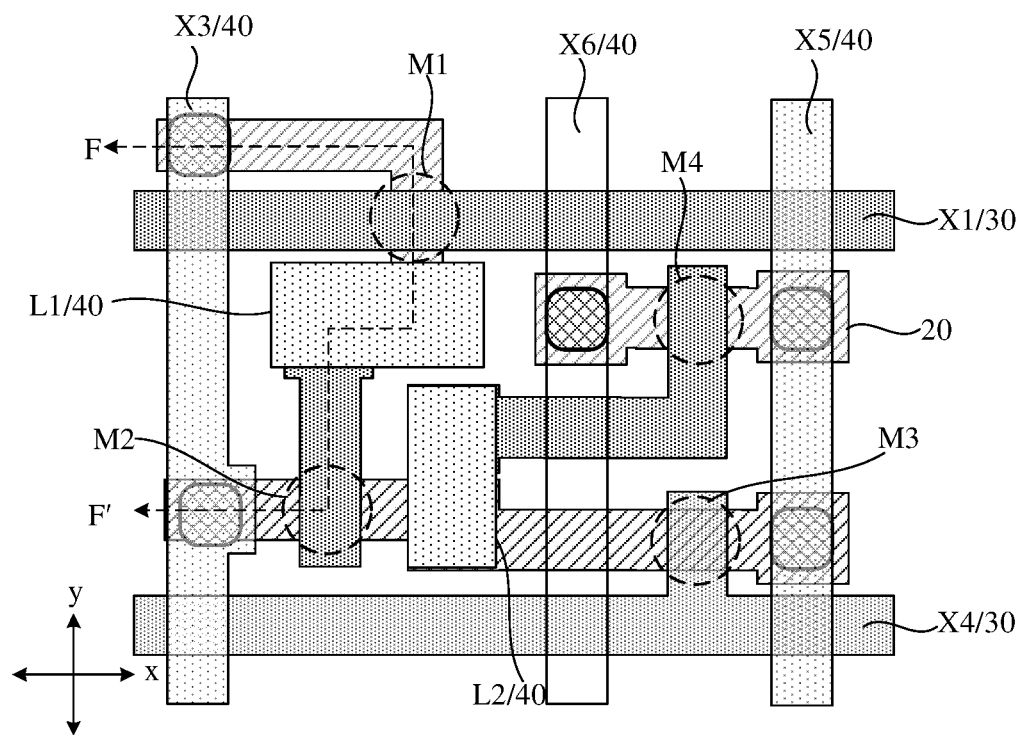
FIG. 9 is a schematic diagram showing a layout design of a photosensitive circuit according to an embodiment of the present disclosure.
Figure 10:
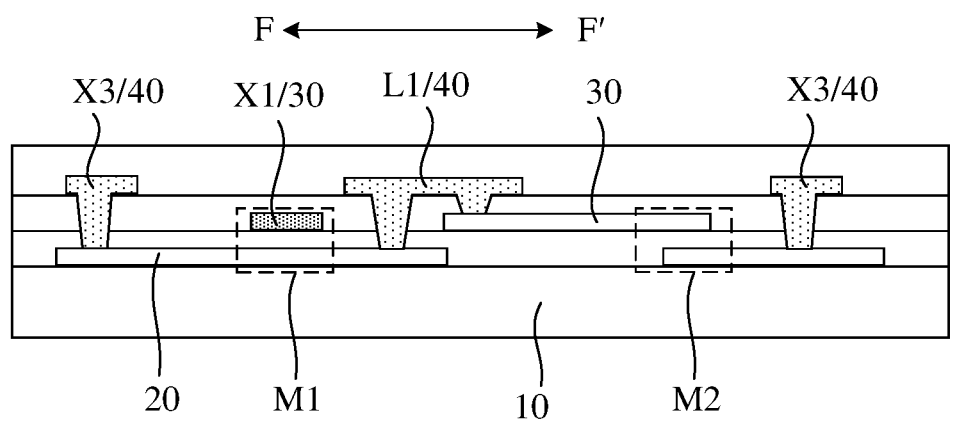
FIG. 10 is a cross-sectional view along line F-F' shown in FIG. 9 according to an embodiment of the present disclosure.

FIG. 9 is a schematic diagram showing a layout design of a photosensitive circuit according to an embodiment of the present disclosure, and FIG. 10 is a cross-sectional view along line F-F shown in FIG. 9 according to an embodiment of the present disclosure. In order to clearly illustrate the connection relationship between the various transistors and the signal lines of the circuit, the photoelectric diode PD is not shown in FIG. 9.

As shown in FIG. 9, the reset control line X1 and the read control line X4 each extend along a first direction x; the first voltage line X3, the second voltage line X5, and the read data line X6 each extend along a second direction y; and the read data line X6 is located between the first voltage line X3 and the second voltage line X5.

A control electrode of a voltage conversion transistor M2 and a control electrode of a read transistor M4 are located on the first virtual straight line, and a reset transistor M1 and a read control transistor M3 are located at two sides of the first virtual straight line, respectively. The first virtual straight line is not shown in FIG. 9 and can be referred to the description in the embodiment shown in FIG. 5.

In the second direction y, the reset transistor M1, the voltage conversion transistor M2, the read control transistor M3, and the read transistor M4 are all located between the reset control line X1 and the read control line X4; and in the first direction x, the reset transistor M1, the voltage conversion transistor M2, the read control transistor M3, and the read transistor M4 are all located between the first voltage line X3 and the second voltage line X5.

In the present disclosure, the photosensitive circuit includes four transistors, and the reset transistor M1 and the read control transistor M3 are located at two sides of the first virtual straight line, respectively. According to the interconnection between the four transistors, the arrangement manner of the four transistors is designed so that the four transistors are arranged in a relatively compact manner, which can save the area occupied by the photosensitive circuit. The reset control line X1 and the read control line X4 each extend in the same direction and are insulated from and cross the first voltage line X3 and the second voltage line X5. The four signal lines shown in FIG. 9 define a space with a similar rectangular shape in which the four transistors of the photosensitive circuit are located. With such configuration, the arrangement of the photosensitive circuit is more regular and compact, which reduces the occupied area of the photosensitive circuit. The layout design according to the present disclosure can increase the number of photosensitive circuits and improve the resolution of the photoelectric sensor when the size of the photoelectric sensor is constant. When it is applied in fingerprint recognition detection, the accuracy of fingerprint detection can be improved.

In an embodiment of the present disclosure, the photoelectric sensor includes a substrate 10, and a semiconductor layer 20, a first metal layer 30 and a second metal layer 40 that are sequentially arranged away from the substrate. Referring to FIG. 9 and FIG. 10, the active layers of various transistors of the photosensitive circuit are located in the semiconductor layer 20. The control electrodes of various transistors of the photosensitive circuit, the reset control line X1, and the read control line X4 are located in the first metal layer 30. The first voltage line X3, the second voltage line X5, and the read data line X6 are located in the second metal layer 40.

The photoelectric sensor can also include a first connection line L1 and a second connection line L2 that are located in the second metal layer 40. The functions of the first connecting line L1 and the second connecting line L2 are the same as those in the above-mentioned embodiment in FIG. 5, and will not be repeated herein.

In some embodiments, the read control signal read and the second voltage signal Vcc are a same voltage signal, and the first electrode of the read control transistor M3 is electrically connected to the control electrode of the read control transistor M3. In this way, signals are provided to the first electrode of the read control transistor M3 and the control electrode of the read control transistor M3 through a same signal line, so that the number of signal lines in the photoelectric sensor can be reduced, thereby saving wiring space and improving the resolution of the photoelectric sensor.

In an embodiment of the present disclosure, the read control signal read and the second voltage signal Vcc are both pulse signals.

Figure 11:
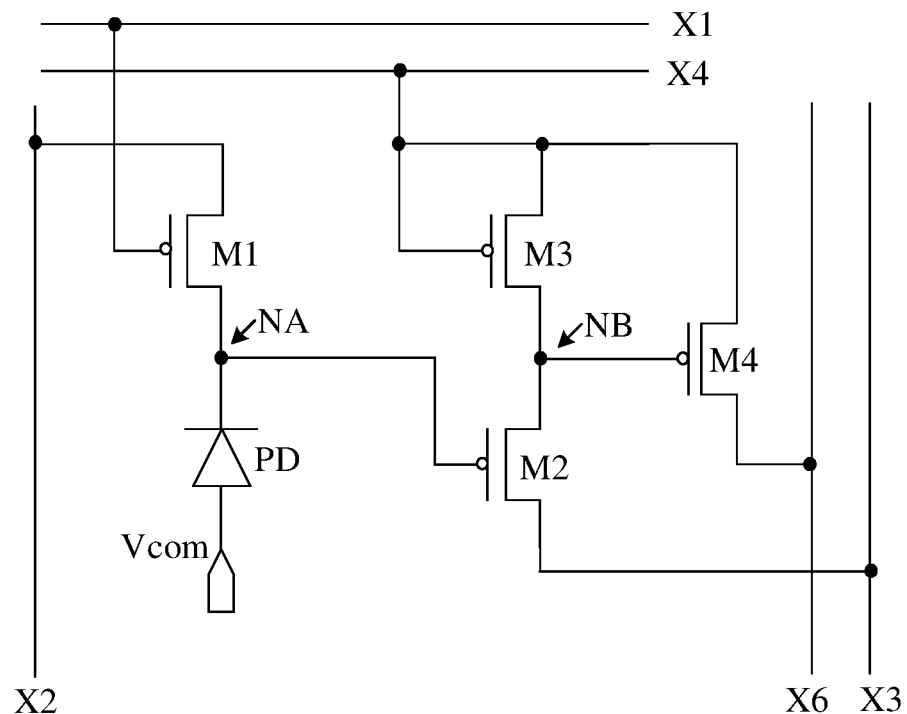
FIG. 11 is a schematic diagram showing a photosensitive circuit according to another embodiment of the present disclosure.
Figure 12:
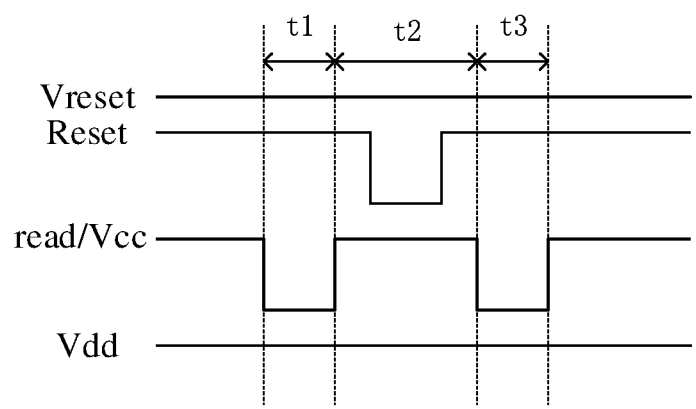
FIG. 12 is a timing sequence diagram showing the photosensitive circuit shown in FIG. 11 according to an embodiment of the present disclosure.

FIG. 11 is a schematic diagram showing a photosensitive circuit according to another embodiment of the present disclosure, and FIG. 12 is a timing sequence diagram showing the photosensitive circuit in FIG. 11 according to an embodiment of the present disclosure.

As shown in FIG. 11, the control electrode of the reset transistor M1 is electrically connected to the reset control line X1 configured to provide a reset control signal Reset. As shown in FIG. 12, a reset control signal Reset is a pulse signal, and the low-level signal of the reset control signal Reset is an enable signal to turn on the reset transistor M1.

A first electrode of the reset transistor M1 is electrically connected to the reset signal line X2 which is configured to provide a reset signal Vreset. As shown in FIG. 12, a reset signal Vreset is a constant voltage signal.

A first electrode of the voltage conversion transistor M2 is electrically connected to the first voltage line X3 configured to provide a first voltage signal Vdd. The first voltage signal Vdd is a constant voltage signal.

The control electrode of the read control transistor M3, the first electrode of the read control transistor M3, and the first electrode of the read transistor M4 are all electrically connected to a read control line X4 configured to provide a read control signal read and the second voltage signal Vcc.

The second electrode of the read transistor M4 is electrically connected to the read data line X6 which is configured to collect a detection signal.

In an embodiment, the signal provided by the read control line X4 is a pulse signal. A low-level signal part in the pulse signal is an enable signal to turn on the read control transistor M3. When the photosensitive circuit is operating in the read stage (the first read stage t1 or the second read stage t3 shown in FIG. 12), the reading control line X4 provides a low-level signal, i.e., the read control signal read and the second voltage signal Vcc are both low level signals in this time period. Providing a low-level signal to the control electrode of the read control transistor M3 can control the read control transistor M3 to turn on. Meanwhile, providing a low-level signal to the first electrode of the read control transistor M3, the read control transistor M3 can be controlled to operate in a linear zone. Moreover, the first electrode of the read transistor M4 also receives the second voltage signal Vcc. When the second voltage signal Vcc is a pulse signal, the second voltage signal Vcc is a high-level signal in the non-read stage, so that the read transistor M4 is prevented from generating a leakage current in the non-read stage which may affect the output of the detection signal.

Figure 13:
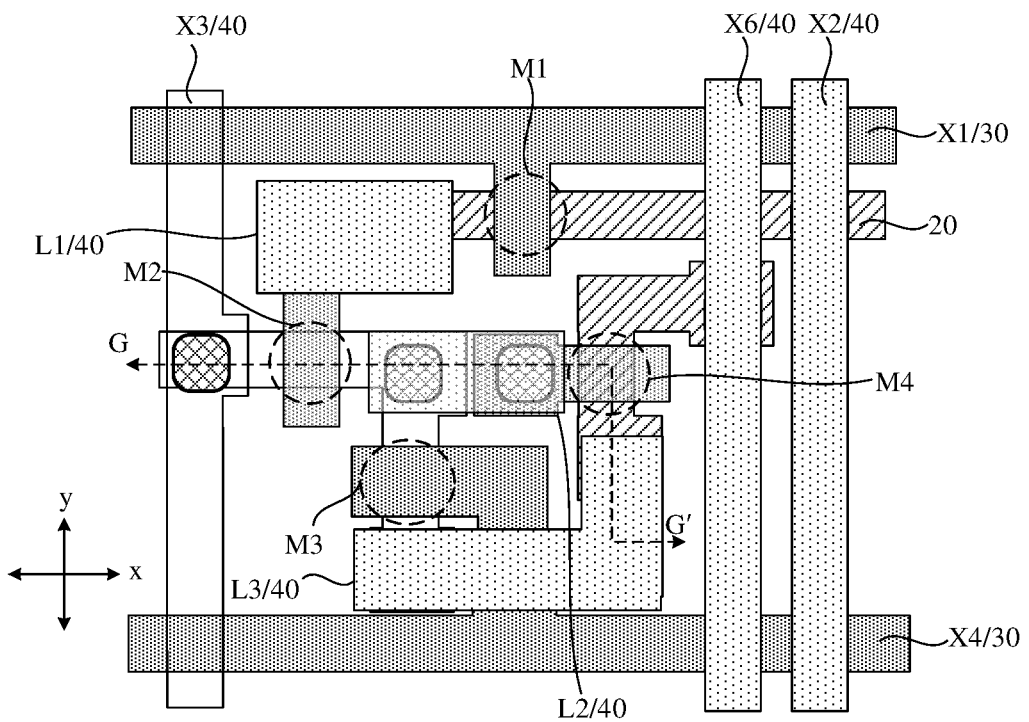
FIG. 13 is a schematic diagram showing a layout design of a photosensitive circuit according to an embodiment of the present disclosure.
Figure 14:
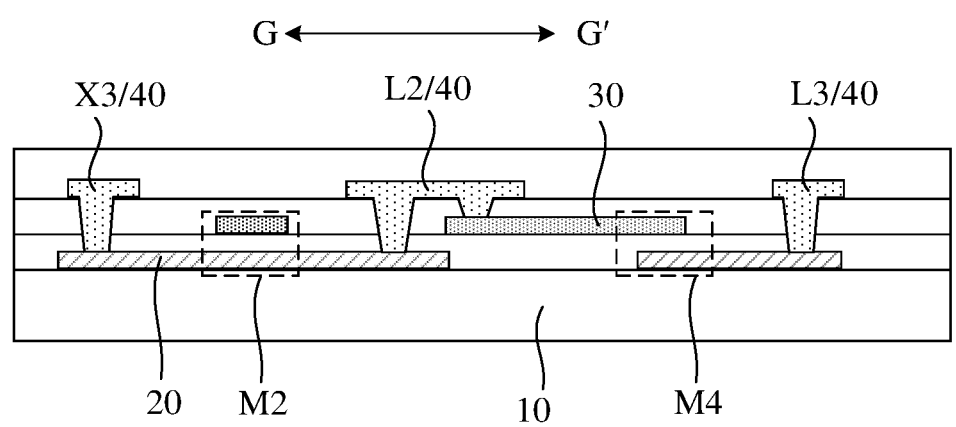
FIG. 14 is a cross-sectional view along line G-G' shown in FIG. 13 according to an embodiment of the present disclosure.

FIG. 13 is a schematic diagram showing a layout design of a photosensitive circuit according to an embodiment of the present disclosure, and FIG. 14 is a cross-sectional view along line G-G' shown in FIG. 13 according to an embodiment of the present disclosure. In order to clearly illustrate the connection relationship between each transistor and the signal line of the circuit, the photoelectric diode PD is not shown in FIG. 13.

As shown in FIG. 13, the reset control line X1 and the read control line X4 each extend along the first direction x, and the first voltage line X3, the read data line X6, and the reset signal line X2 each extend along the second direction y.

The control electrode of the voltage conversion transistor M2 and the control electrode of the read transistor M4 are located on a first virtual straight line, and the reset transistor M1 and the read control transistor M3 are located at two sides of the first virtual straight line, respectively. The first virtual straight line is not shown in FIG. 1 and can be referred to the description of the embodiment shown in FIG. 5.

In the second direction y, the reset transistor M1, the voltage conversion transistor M2, the read control transistor M3, and the read transistor M4 are all located between the reset control line X1 and the read control line X4. In the first direction x, the reset transistor M1, the voltage conversion transistor M2, the read control transistor M3, and the read transistor M4 are all located between the first voltage line X3 and the read data line X6.

In the present disclosure, the photosensitive circuit includes four transistors. The reset transistor M1 and the read control transistor M3 are located at two sides of the first virtual straight line, respectively. According to the interconnection between the four transistors, the arrangement manner of the four transistors is designed so that the four transistors are arranged in a relatively compact manner, which can save the area occupied by the photosensitive circuit. The reset control line X1 and the read control line X4 each extend in the same direction and are insulated from and cross the first voltage line X3 and the read data line X6. The four signal lines shown in FIG. 13 define a space with a similar rectangular shape in which the four transistors of the photosensitive circuit are located. With such configuration, the arrangement of the photosensitive circuit is more regular and compact, which reduces the occupied area of the photosensitive circuit. The layout design according to the present disclosure can increase the number of photosensitive circuits and improve the resolution of the photoelectric sensor when the size of the photoelectric sensor is fixed. When it is applied in fingerprint recognition detection, the accuracy of fingerprint detection can be improved.

In an embodiment of the present disclosure, the photoelectric sensor includes a substrate 10, and a semiconductor layer 20, a first metal layer 30 and a second metal layer 40 that are sequentially located facing away from the substrate. Referring to FIG. 13 and FIG. 14, the active layers of various transistors of the photosensitive circuit are located in the semiconductor layer 20. The control electrodes of various transistors of the photosensitive circuit, the reset control line X1, and the read control line X4 are located in the first metal layer 30. The first voltage line X3, the reset signal line X2 and the read data line X6 are located in the second metal layer 40.

The photoelectric sensor further includes a first connection line L1, a second connection line L2, and a third connection line L3. The first connection line L1, the second connection line L2, and the third connection line L3 are all located in the second metal layer 40. The functions of the first connecting line L1 and the second connecting line L2 are the same as those in the above-mentioned embodiment in FIG. 5, and will not be elaborated here. The first electrode of the read control transistor M3 is connected to the third connection line L3 through a via, the first electrode of the read transistor M4 is connected to the third connection line L3 through a via, and the third connection line L3 is connected to the read control signal read through a via, so that the first electrode of the read control transistor M3 is electrically connected to the control electrode of the read control transistor M3, and the first electrode of the read transistor M4 is electrically connected to the first electrode of the read control transistor M3.

Figure 15:
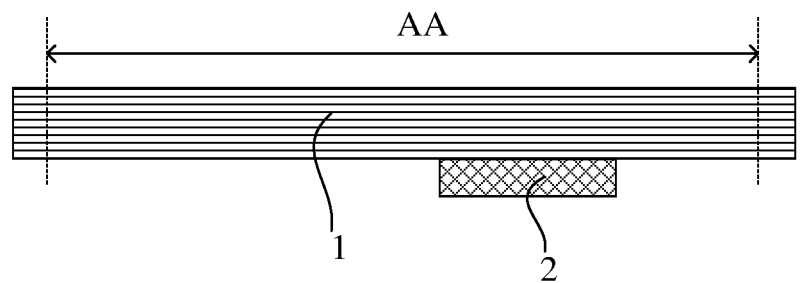
FIG. 15 is a schematic diagram showing a display module according to an embodiment of the present disclosure.

The present disclosure further provides a display module. FIG. 15 is a schematic diagram showing a display module according to an embodiment of the present disclosure. As shown in FIG. 15, the display module includes a display panel 1 and a photoelectric sensor 2 provided by any one of embodiments of the present disclosure. The photoelectric sensor 2 is bonded to the back of the display panel 1 and overlaps with a display area of the display panel 1. The back of the display panel 1 is the back side of the display screen. The display panel 1 is an organic light-emitting display panel or an inorganic light-emitting display panel. The photoelectric sensor 2 can be configured for fingerprint recognition detection to achieve the fingerprint recognition function of the display module.

Figure 16:
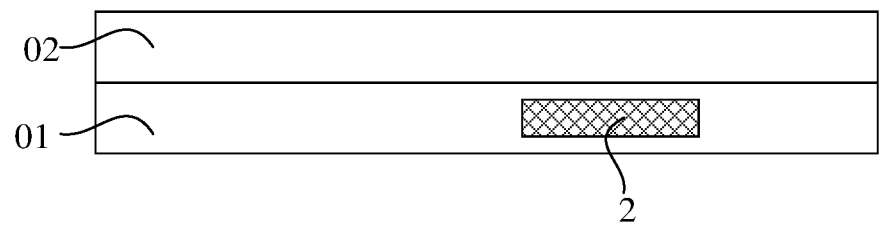
FIG. 16 is a schematic diagram showing a display module according to another embodiment of the present disclosure.

The present disclosure further provides a display module. FIG. 16 is a schematic diagram showing a display module according to another embodiment of the present disclosure. As shown in FIG. 16, the display module includes a photoelectric sensor 2 provided by any one of embodiments of the present disclosure. The display module includes an array layer 01 and a display layer 02 that are stacked, and the photoelectric sensor 2 is integrated in the array layer 01 of the display module. In an embodiment of the present disclosure, each of transistors of the photosensitive circuit is a p-type transistor, so that the photoelectric sensor can be manufactured in the same process as the driving circuit in the array layer 01, thereby reducing a thickness of the display module.

Figure 17:
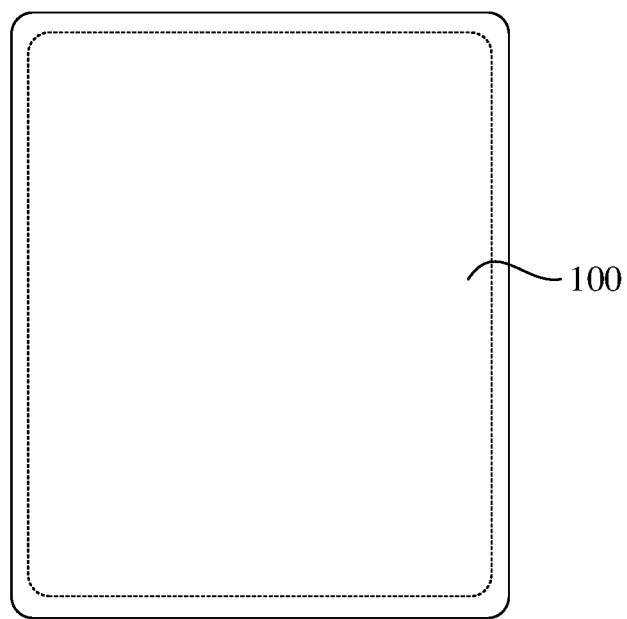
FIG. 17 is a schematic diagram showing a display apparatus according to an embodiment of the present disclosure.

The present disclosure further provides a display apparatus. FIG. 17 is a schematic diagram showing a display apparatus according to an embodiment of the present disclosure. As shown in FIG. 17, the display apparatus includes a display module 100 provided by any one of embodiments of the present disclosure. The display apparatus provided by the present disclosure can be any electronic device having a display function, such as a mobile phone, a tablet computer, a laptop computer, an electronic paper book, a television, a smart watch, or the like.

The above are merely some embodiments of the present disclosure, which, as mentioned above, are not intended to limit the present disclosure. Within the principles of the present disclosure, any modification, equivalent substitution, improvement shall fall into the protection scope of the present disclosure.

Finally, it should be noted that the technical solutions of the present disclosure are illustrated by the above embodiments, but not intended to limit thereto. Although the present disclosure has been described in detail with reference to the foregoing embodiments, those skilled in the art can understand that the present disclosure is not limited to the specific embodiments described herein, and can make various obvious modifications, replacements, and substitutions without departing from the scope of the present disclosure.

What is claimed is:

1. A photoelectric sensor, comprising:
a photosensitive circuit, wherein the photosensitive circuit comprises a photoelectric diode, a reset transistor, a voltage conversion transistor, a read control transistor, a read transistor, a first node, and a second node;
wherein the read transistor is a p-type transistor;
wherein the reset transistor, a first electrode of the photoelectric diode, and a control electrode of the voltage conversion transistor are all electrically connected to the first node;
wherein the voltage conversion transistor, the read control transistor, and a control electrode of the read transistor are all electrically connected to the second node;
wherein the reset transistor is configured to be turned on under control of a control electrode of the reset transistor to reset the first node;
wherein the voltage conversion transistor and the read control transistor are configured to turn on under control of the control electrode of the voltage conversion transistor and a control electrode of the read control transistor, respectively, to control a voltage of the second node;
wherein the read transistor is configured to output a detection signal under control of the control electrode of the read transistor
wherein the voltage conversion transistor further comprises a first electrode configured to directly receive a first voltage signal, and a second electrode electrically connected to the second node;
wherein the control electrode of the read control transistor is configured to receive a read control signal;
wherein the read control transistor further comprises a first electrode configured to directly receive a second voltage signal, and a second electrode electrically connected to the second node;
wherein the read transistor further comprises a first electrode configured to directly receive the second voltage signal;
wherein the photoelectric diode further comprises a second electrode configured to receive a common voltage signal;
wherein the first voltage signal has a voltage value greater than a voltage value of the second voltage signal and a voltage value of the common voltage signal.

2. The photoelectric sensor according to claim 1, wherein the control electrode of the reset transistor is configured to receive a reset control signal, and wherein the reset transistor further comprises a first electrode configured to receive a reset signal, and a second electrode electrically connected to the first node; and
wherein the read transistor is turned on under control of a voltage of the control electrode of the read transistor to output the detection signal.

3. The photoelectric sensor according to claim 2, wherein the control electrode of the reset transistor is electrically connected to a reset control line configured to provide the reset control signal;
wherein the first electrode of the reset transistor is electrically connected to a reset signal line configured to provide the reset signal;
wherein the first electrode of the voltage conversion transistor is electrically connected to a first voltage line configured to provide the first voltage signal;
wherein the control electrode of the read control transistor is electrically connected to a read control line configured to provide the read control signal;
wherein the first electrode of the read control transistor and the first electrode of the read transistor are electrically connected to a second voltage line configured to provide the second voltage signal; and
wherein the read transistor further comprises a second electrode electrically connected to a read data line configured to collect the detection signal.

4. The photoelectric sensor according to claim 3, wherein the reset control line, the read control line, and the second voltage line each extend along a first direction, and the read control line is located between the reset control line and the second voltage line;
wherein the first voltage line, the reset signal line, and the read data line each extend along a second direction intersecting with the first direction;
wherein the control electrode of the voltage conversion transistor and the control electrode of the read transistor are located on a first virtual straight line, and the reset transistor and the read control transistor are located at two sides of the first virtual straight line, respectively;
wherein, in the second direction, the reset transistor, the voltage conversion transistor, the read control transistor, and the read transistor are all located between the reset control line and the second voltage line; and
wherein, in the first direction, the reset transistor, the voltage conversion transistor, the read control transistor, and the read transistor are all located between the first voltage line and the read data line.

5. The photoelectric sensor according to claim 4, further comprising:
a substrate; and
a semiconductor layer, a first metal layer, and a second metal layer that are sequentially arranged facing away from the substrate,
wherein each of the reset transistor, the voltage conversion transistor, the read control transistor, and the read transistor comprises an active layer located in the semiconductor layer;
wherein the control electrode of the reset transistor, the control electrode of the voltage conversion transistor, the control electrode of the read control transistor, the control electrode of the read transistor, the reset control line, the read control line, and the second voltage line are located in the first metal layer; and
wherein the first voltage line, the reset signal line, and the read data line are located in the second metal layer.

6. The photoelectric sensor according to claim 2, wherein the control electrode of the reset transistor is electrically connected to a reset control line configured to provide the reset control signal;
wherein the first electrode of the reset transistor and the first electrode of the voltage conversion transistor are electrically connected to a first voltage signal line, the first voltage signal line is configured to provide the reset signal to the first electrode of the reset transistor during a first period, and configured to provide the first voltage signal to the first electrode of the voltage conversion transistor during a second period, and the reset signal has a voltage value different from a voltage value of the first voltage signal;
wherein the control electrode of the read control transistor is electrically connected to a read control line configured to provide the read control signal;
wherein the first electrode of the read control transistor and the first electrode of the read transistor are electrically connected to the second voltage line configured to provide the second voltage signal; and
wherein the read transistor further comprises a second electrode electrically connected to a read data line configured to collect the detection signal.

7. The photoelectric sensor according to claim 6, wherein the reset control line and the read control line each extend along a first direction;
wherein the first voltage line, the second voltage line, and the read data line each extend along a second direction intersecting with the first direction, and the read data line is located between the first voltage line and the second voltage line;
wherein the control electrode of the voltage conversion transistor and the control electrode of the read transistor are located on a first virtual straight line, and the reset transistor and the read control transistor are located at two sides of the first virtual straight line, respectively;
wherein, in the second direction, the reset transistor, the voltage conversion transistor, the read control transistor, and the read transistor are all located between the reset control line and the read control line; and
wherein, in the first direction, the reset transistor, the voltage conversion transistor, the read control transistor, and the read transistor are all located between the first voltage line and the second voltage line.

8. The photoelectric sensor according to claim 2, wherein the read control signal and the second voltage signal are a same voltage signal, and the first electrode of the read control transistor is electrically connected to the control electrode of the read control transistor.

9. The photoelectric sensor according to claim 8, wherein the control electrode of the reset transistor is electrically connected to a reset control line configured to provide the reset control signal; wherein the first electrode of the reset transistor is electrically connected to a reset signal line configured to provide the reset signal;
wherein the first electrode of the voltage conversion transistor is electrically connected to a first voltage line configured to provide the first voltage signal;
wherein the control electrode of the read control transistor, the first electrode of the read control transistor, and the first electrode of the read transistor are all electrically connected to a read control line configured to provide the read control signal and the second voltage signal; and
wherein the read transistor further comprises a second electrode electrically connected to a read data line configured to collect the detection signal.

10. The photoelectric sensor according to claim 9, wherein the reset control line and the read control line each extend along a first direction; and the first voltage line, the read data line, and the reset signal line each extend along a second direction intersecting with the first direction;
wherein the control electrode of the voltage conversion transistor and the control electrode of the read transistor are located on a first virtual straight line, and the reset transistor and the read control transistor are located at two sides of the first virtual straight line, respectively;
wherein, in the second direction, the reset transistor, the voltage conversion transistor, the read control transistor, and the read transistor are all located between the reset control line and the read control line; and
wherein, in the first direction, the reset transistor, the voltage conversion transistor, the read control transistor, and the read transistor are all located between the first voltage line and the read data line.

11. A method for driving a photoelectric sensor, wherein the photoelectric sensor comprises a photosensitive circuit, wherein the photosensitive circuit comprises a photoelectric diode, a reset transistor, a voltage conversion transistor, a read control transistor, a read transistor, a first node, and a second node, wherein the read transistor is a p-type transistor; the reset transistor, a first electrode of the photoelectric diode, and a control electrode of the voltage conversion transistor are all electrically connected to the first node; and the voltage conversion transistor, the read control transistor, and a control electrode of the read transistor are all electrically connected to the second node; wherein the reset transistor is configured to be turned on under control of a control electrode of the reset transistor to reset the first node; wherein the voltage conversion transistor and the read control transistor are configured to turn on under control of the control electrode of the voltage conversion transistor and a control electrode of the read control transistor, respectively, to control a voltage of the second node; wherein the read transistor is configured to output a detection signal under control of the control electrode of the read transistor; wherein the voltage conversion transistor further comprises a first electrode configured to directly receive a first voltage signal, and a second electrode electrically connected to the second node; wherein the control electrode of the read control transistor is configured to receive a read control signal; wherein the read control transistor further comprises a first electrode configured to directly receive a second voltage signal, and a second electrode electrically connected to the second node; wherein the read transistor further comprises a first electrode configured to directly receive the second voltage signal; wherein the photoelectric diode further comprises a second electrode configured to receive a common voltage signal; wherein the first voltage signal has a voltage value greater than a voltage value of the second voltage signal and a voltage value of the common voltage signal; and wherein the method comprises:
  controlling the photosensitive circuit to operate in a read stage of a working cycle,
  wherein, in the read stage, a voltage of the first node is provided to the control electrode of the voltage conversion transistor in such a manner that the voltage conversion transistor is controlled to be turned on, and simultaneously another voltage is provided to a control electrode of the read control transistor in such a manner that the read control transistor is controlled to be turned on, and the voltage conversion transistor and the read control transistor jointly control a voltage of the second node; and
  wherein in the read stage, the read transistor outputs a detection signal under control of the second node.

12. The method according to claim 11, wherein jointly controlling the voltage of the second node by the voltage conversion transistor and the read control transistor comprises:
  controlling the voltage of the second node to vary with the voltage of the first node; and
  wherein outputting the detection signal by the read transistor under the control of the second node comprises:
  turning on the read transistor in such a manner that the detection signal output by the read transistor varies with the voltage of the second node.

13. The method according to claim 12, wherein controlling the voltage of the second node to vary with the voltage of the first node comprises:
  controlling the voltage of the second node to increase as the voltage of the first node decreases.

14. The method according to claim 12, wherein turning on the read transistor under the control of the second node in such a manner that the detection signal output by the read transistor varies with the voltage of the second node, comprises:
  controlling the detection signal output by the read transistor to decrease as the voltage of the second node increases.

15. The method according to claim 12, wherein providing the voltage of the first node to the control electrode of the voltage conversion transistor in such a manner that the voltage conversion transistor is controlled to be turned on, and simultaneously providing the another voltage to the control electrode of the read control transistor in such a manner that the read control transistor is controlled to be turned on, comprises:
  wherein providing the voltage of the first node to the control electrode of the voltage conversion transistor in such a manner that the voltage conversion transistor operates in a linear zone of the voltage conversion transistor, wherein a turn-on resistance of the voltage conversion transistor varies with the voltage of the first node; and
  wherein providing a constant voltage signal to the control electrode of the read control transistor in such a manner that the read control transistor is controlled to operate in a linear zone of the read control transistor.

16. The method according to claim 15, wherein a second electrode of the voltage conversion transistor and a second electrode of the read control transistor are electrically connected to the second node;
  wherein said providing the voltage of the first node to the control electrode of the voltage conversion transistor in such a manner that the voltage conversion transistor operates in the linear zone of the voltage conversion transistor comprises:
    providing the voltage of the first node to the control electrode of the voltage conversion transistor; and providing the first voltage signal to a first electrode of the voltage conversion transistor in such a manner that the voltage conversion transistor operates in the linear zone of the voltage conversion transistor; and
  wherein said providing the constant voltage signal to the control electrode of the read control transistor in such a manner that the read control transistor is controlled to operate in the linear zone of the read control transistor, comprises:
    providing a read control signal to the control electrode of the read control transistor; and
    providing the second voltage signal to a first electrode of the read control transistor in such a manner that the read control transistor is controlled to operate in the linear zone of the read control transistor.

17. The method according to claim 16, wherein said controlling the voltage of the second node to vary with the voltage of the first node, further comprises:
  controlling a value of the voltage of the second node to be between a voltage value of the first voltage signal and a voltage value of the second voltage signal.

18. The method according to claim 12, wherein turning on the read transistor under the control of the second node in such a manner that the detection signal output by the read transistor varies with the voltage of the second node, comprises:
  controlling the read transistor to operate in a saturation zone of the read transistor under the control of the second node.

19. The method according to claim 11, further comprising:
  controlling the photosensitive circuit to operate in a reset stage of the working cycle, wherein in the reset stage, a reset control signal is provided to a control electrode of the reset transistor, a reset signal is provided to a first electrode of the reset transistor, and the first node is reset by the reset signal after the reset transistor is controlled to be turned on; and
  wherein the voltage value of the common voltage signal is has a voltage value smaller than a voltage value of the reset signal.

20. A display apparatus, comprising:
  a photoelectric sensor, wherein the photoelectric sensor comprises a photosensitive circuit, wherein the photosensitive circuit comprises a photoelectric diode, a reset transistor, a voltage conversion transistor, a read control transistor, a read transistor, a first node, and a second node, and
  wherein the read transistor is a p-type transistor;
  wherein the reset transistor, a first electrode of the photoelectric diode, and a control electrode of the voltage conversion transistor are all electrically connected to the first node;
  wherein the voltage conversion transistor, the read control transistor, and a control electrode of the read transistor are all electrically connected to the second node;

wherein the reset transistor is configured to be turned on under control of a control electrode of the reset transistor to reset the first node;

wherein the voltage conversion transistor and the read control transistor are configured to turn on under control of the control electrode of the voltage conversion transistor and a control electrode of the read control transistor, respectively, to control a voltage of the second node;

wherein the read transistor is configured to output a detection signal under control of the control electrode of the read transistor;

wherein the voltage conversion transistor further comprises a first electrode configured to directly receive a first voltage signal, and a second electrode electrically connected to the second node;

wherein the control electrode of the read control transistor is configured to receive a read control signal;

wherein the read control transistor further comprises a first electrode configured to directly receive a second voltage signal, and a second electrode electrically connected to the second node;

wherein the read transistor further comprises a first electrode configured to directly receive the second voltage signal; and wherein the photoelectric diode further comprises a second electrode configured to receive a common voltage signal;

wherein the first voltage signal has a voltage value greater than a voltage value of the second voltage signal and a voltage value of the common voltage signal.

* * * * *